United States Patent [19]
Aizaki

[11] Patent Number: 5,305,257
[45] Date of Patent: Apr. 19, 1994

[54] SEMICONDUCTOR INTEGRATED CIRCUIT

[75] Inventor: Shingo Aizaki, Tokyo, Japan

[73] Assignee: NEC Corporation, Tokyo, Japan

[21] Appl. No.: 935,208

[22] Filed: Aug. 26, 1992

[30] Foreign Application Priority Data

Aug. 26, 1991 [JP] Japan .................... 3-212557

[51] Int. Cl.$^5$ .............................. G11C 13/00
[52] U.S. Cl. ...................... 365/149; 365/182; 365/239
[58] Field of Search ............ 365/182, 189.01, 189.03, 365/189.04, 189.08, 204, 149, 239

[56] References Cited

U.S. PATENT DOCUMENTS 5,084,842 1/1992 Tsuchida et al. .................. 365/204

Primary Examiner—Terrell W. Fears
Attorney, Agent, or Firm—Sughrue, Mion, Zinn, Macpeak & Seas

[57] ABSTRACT

A semiconductor integrated circuit includes "n" cascaded inverters $IV_j$ ("j"="1" to "n") formed of MOS transistors. The size of an input side MOS transistor and the size of an output side MOS transistor of each inverter are determined so that an input capacitance $CG_j$ and an output load capacitance $CL_j$ of each inverter satisfy the following relationships: $F_j = (CG_{(j+1)} + CL_j)/CG_j$ and $F_{(j+1)} = F_j - (CL_j/CG_j)$.

5 Claims, 2 Drawing Sheets

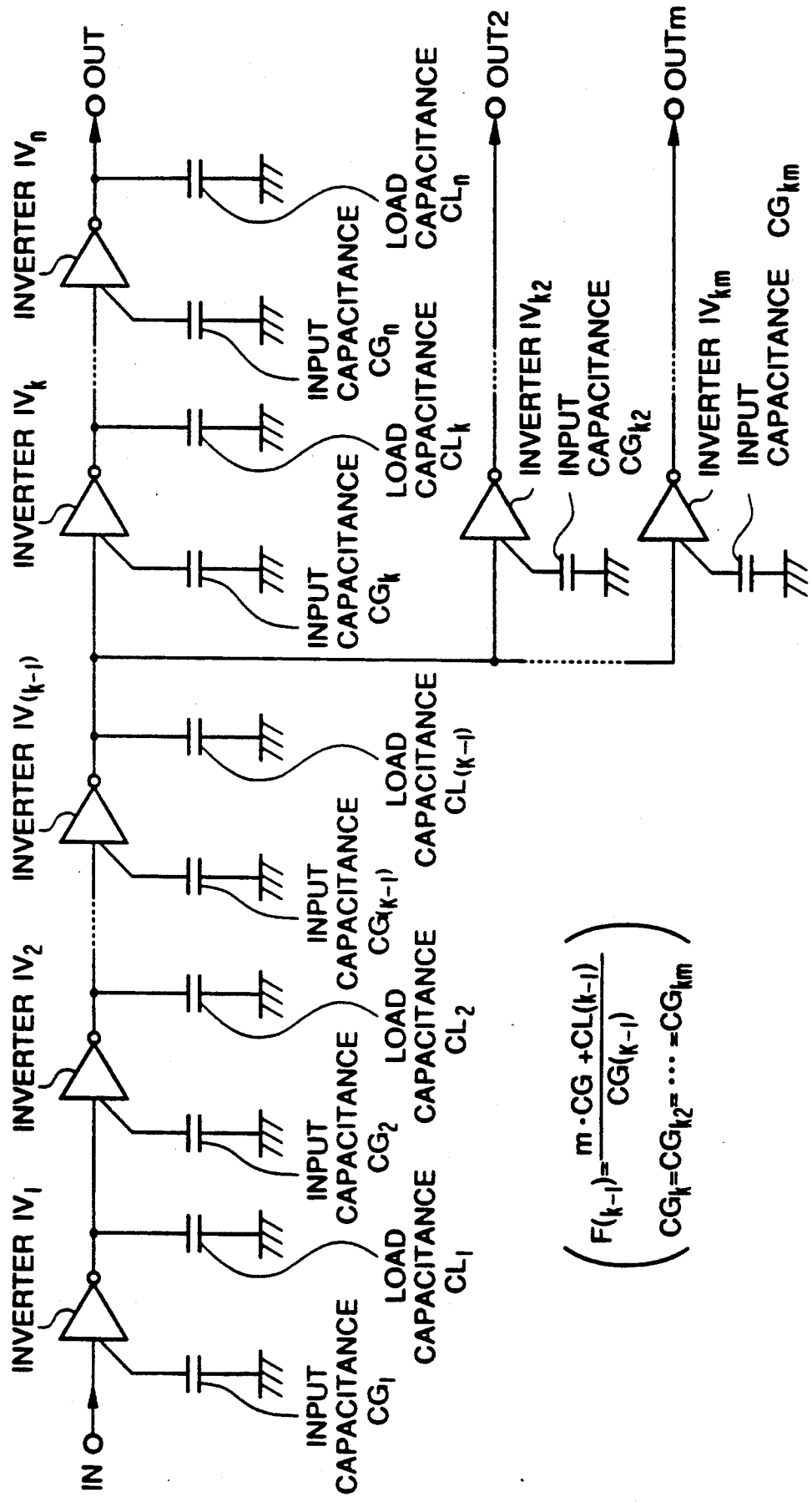

SEMICONDUCTOR INTEGRATED CIRCUIT

BACKGROUND OF THE INVENTION

1. Field of the Invention

The present invention relates to a semiconductor integrated circuit, and more specifically to a semiconductor integrated circuit composed of a plurality of cascased basic unitary circuits formed of MOS transistors.

2. Description of Related Art

Recently, systems constituted of semiconductor integrated circuits have rapidly improved their performance, and accordingly, the semiconductor integrated circuits incorporated in the systems have been required to have even better performance. By way of example, SRAMs (static random access memory) have been subjected to a rapidly increasing request for an operation speed, with an increasing application of the SRAM as a main memory for a supercomputer and others.

In order to fulfill the desire for the operation speed, it is necessary to shorten a response time of MOS transistors which constitute the semiconductor integrated circuit. However, main conventional means include improvement of a process technology, such as decrease of input gate capacitance due to a skate ring of MOS transistors, and increase of current driving capability.

In addition to improvement by the process technology, a speed-up due to improvement of circuit technology is required in order to improve the operation speed. However, a clear procedure for designing the gate length and the gate width of MOS transistors which are the basis for speeding-up of the response time has not yet been shown, and therefore, these factors have been determined by a trial-and-error manner such as by simulation.

As mentioned above, in order to obtain the high speed operation, the conventional semiconductor integrated circuits have been configured to determine the size of MOS transistors by means of the process technology and the trial-and-error type design procedure such as by simulation. In other words, it has not been possible to obtain a semiconductor integrated circuit having the highest operation speed supported by a theory. In addition, a long time has been required until an expected performance is obtained.

SUMMARY OF THE INVENTION

Accordingly, it is an object of the present invention to provide a semiconductor integrated circuit capable of easily obtaining the highest operation speed supported by a theory.

The above and other objects of the present invention are achieved in accordance with the present invention by a semiconductor integrated circuit comprising "n" cascaded basic unitary circuits each formed of MOS transistors, each of the unitary circuits having an input terminal having a predetermined input capacitance and an output having a predetermined output capacitance, a (j)th unitary circuit (where "j" is any integer from "1" to "n" inclusive) having the value $CG_j$ of the input capacitance and the value $CL_j$ of a load capacitance which is the sum of the output capacitance of the (j)th unitary circuit and an output parasitic capacitance other than the input capacitance of a (j+1)th unitary circuit having the input terminal connected to the output terminal of the (j)th unitary circuit, the size of an input side MOS transistor and the size of an output side MOS transistor of each of the unitary circuits being determined to fulfil the following relation:

$$F_j = (CG_{(j+1)} + CL_j)/CG_j$$

$$F_{(j+1)} = F_j - (CL_j/CG_j)$$

where $F_j$ is a fan out of the (j)th unitary circuit.

The above and other objects, features and advantages of the present invention will be apparent from the following description of preferred embodiments of the invention with reference to the accompanying drawings.

BRIEF DESCRIPTION OF THE DRAWINGS

FIG. 2 is a circuit diagram of a second embodiment of the semiconductor integrated circuit in accordance with the present invention.

DESCRIPTION OF THE PREFERRED EMBODIMENTS

Figure 1:
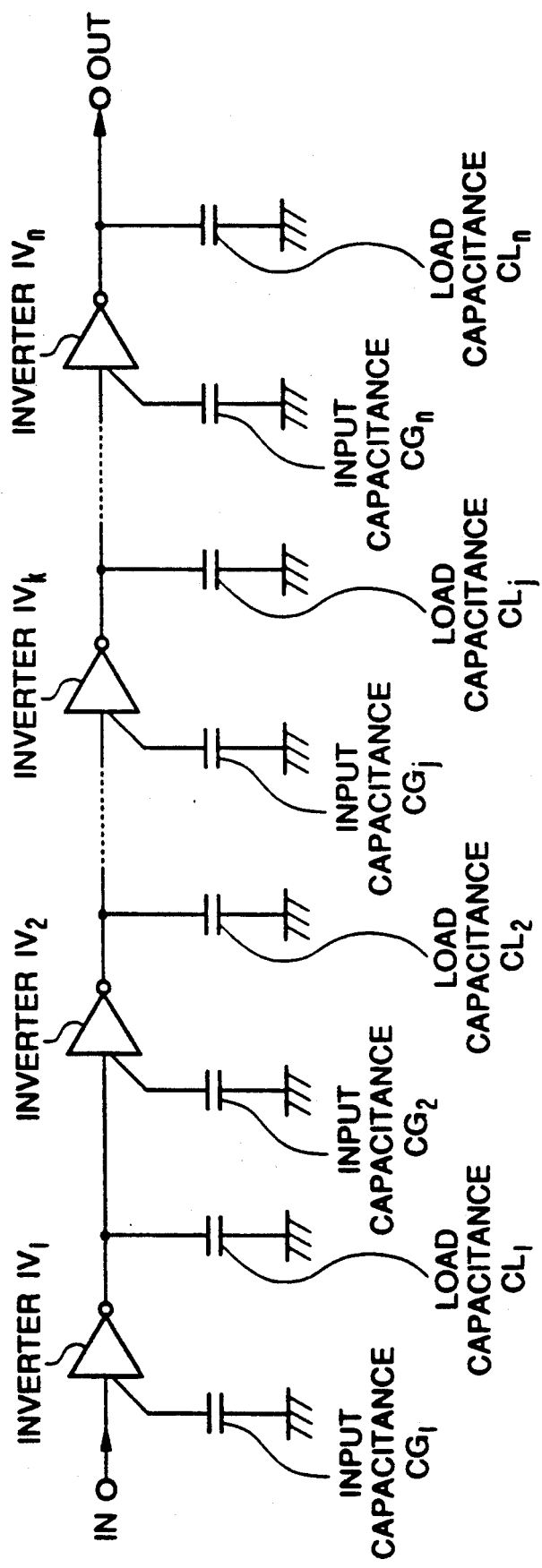
FIG. 1 is a circuit diagram of a first embodiment of the semiconductor integrated circuit in accordance with the present invention.

Referring to FIG. 1, there is shown a circuit diagram of a first embodiment of the semiconductor integrated circuit in accordance with the present invention.

The shown circuit includes "n" cascaded inverters (basic unitary circuits) $IV_1$ to $IV_n$ each formed of MOS transistors, and each of the inverters $IV_1$ to $IV_n$ has an input terminal having a predetermined input capacitance $CG_j$ (where "j" is any integer from "1" to "n" inclusive) and an output having a predetermined output capacitance. The output terminal of each of the inverters $IV_1$ to $IV_n$ has an output load capacitance $CL_j$ which is a sum of the output capacitance of the inverter itself and an output parasitic capacitance other than the input capacitance of a next stage inverter. Here, defining that the value of the input capacitance and the value of the output load capacitance of the (j)th inverter $IV_j$ and $CG_j$ and $CL_j$, respectively, the size of an input side MOS transistor and the size of an output side MOS transistor of each of the inverters are determined to fulfill the following relation:

$$F_j = (CG_{(j+1)} + CL_j)/CG_j \tag{1a}$$

$$F_{(j+1)} = F_j - (CL_j/CG_j) \tag{1b}$$

A response time $T_j$ ($T_1$ to $T_n$) of each stage is defined as follows:

$$T_j = \alpha F_j + \beta \tag{2}$$

where $\alpha$ and $\beta$ are positive constants determined by the input capacitance and the current driving capability of each inverter $IN_1$ to $IV_n$.

In the following, a minimum value of the total response time of the n-stage inverter circuit as shown in FIG. 1 is sought.

First, the input capacitance of each stage can be shown as follows from the equation (1a).

$$CG_n = CL_n/F_n$$
$$CG_{(n-1)} = (CG_n + CL_{(n-1)})/F_{(n-1)}$$
$$= \{CL_n/(F_n \times F_{(n-1)})\} + (CL_{(n-1)}/F_{(n-1)})$$
$$CG_{(n-2)} = (CG_{(n-1)} + CL_{(n-2)})/F_{(n-2)}$$
$$= \{CL_n/(F_n \times F_{(n-1)} \times F_{(n-2)})\} +$$
$$\{CL_{(n-1)}/(F_{(n-1)} \times F_{(n-2)})\} +$$
$$(CL_{(n-2)}/F_{(n-2)})$$

Therefore, the input capacitance can be generally shown as follows:

$$CG_j = \{CL_n/(F_n \times \ldots \times F_j)\} + \{CL_{(n-1)}/(F_{(n-1)} \times \ldots F_j)\} + \ldots + (CL_j/F_j) \quad (3).$$

Here, the total response time $T_{pd}$ is expressed as follows from the equation (2):

$$T_{pd} = \alpha(F_1 + \ldots F_n) + n\beta \quad (4).$$

Therefore, the value of the equation (4) can be minimized if the factor $F_j$ ($F_1$ to $F_n$) fulfilling the following relations (5) and (6) is sought:

$$\partial T_{pd}/\partial F_j = 0 \text{ (where "j"="1" to "n")} \quad (5)$$

$$\partial^2 T_{pd}/\partial F_j^2 > 0 \text{ (where "j"="1" to "n")} \quad (6).$$

Here, the equation (3) can be modified as follows:

$$F_j = [CL_n/(F_n \times \ldots \times F_{(j+1)}) + CL_{(n-1)}/([F_{(n-1)} \times \ldots \times F_{(j+1)}) + CL_{(j+1)}/(F_{(j+1)}) + CL_j]/CG_j \quad (7).$$

If the equation (7) is substituted in the equation (4), the following equation (8) is obtained:

$$T_{pd} = \alpha[F_n + \ldots + F_{(j+1)} + \{CL_n/(F_n \times \ldots \times F_{(j+1)}) + CL_{(n-1)}/(F_{(n-1)} \times \ldots \times F_{(j+1)}) + \ldots + CL_{(j+1)}/(F_{(j+1)}) + CL_j\}CG_j \ldots + F_1] + n\beta \quad (8).$$

Therefore, if a differential operation is executed similarly to the equations (5) and (6), the following equation (9) is obtained:

$$\partial T_{pd}/\partial F_{(j+1)} = \alpha[1 - (1/CG_j) \times (1/F_{(j+1)}) \times \{CL_n/(F_n \times \ldots \times F_{(j+1)}) + CL_{(n-1)}/(F_{(n-1)} \times \ldots \times F_{(j+1)}) + \ldots + CL_{(j+1)}/(F_{(j+1)})\}] \quad (9).$$

Therefore, in order to fulfill the equation (5), if the equation (9) is deemed to be "0" (zero) and is modified by using the equation (7), the following equations can be obtained:

$$\alpha\{1 - (F_j \times CG_j - CL_j)/(CG_j \times F_{(j+1)})\} = 0 \text{ therefore,}$$
$$F_{(j+1)} = F_j - CL_j/CG_j \quad (10).$$

In addition, since it is clear that the value of the equation (9) is positive, if the equation (10) is fulfilled, it is sufficient in order to minimize the total response time $T_{pd}$.

Accordingly, according to the above mentioned embodiment, if the output load capacitance $CL_j$ is determined at any value, and if the input capacitance of at least two stages of the n-stage inverter circuit and hence the gate length and the gate width of the MOS transistor of the at least two stages are determined, the gate length and the gate width (transistor size) of MOS transistors of the other stages or inverters can be unconditionally determined so as to have a minimized response time.

Referring to FIG. 2, there is shown a circuit diagram of a second embodiment of the semiconductor integrated circuit in accordance with the present invention. In this figure, elements corresponding to those shown in FIG. 1 are given the same reference numerals, and explanation thereof will be omitted.

As seen from a comparison between FIGS. 1 and 2, the second embodiment is such that "m" inverters $IV_k$, $IV_{k2}$ to $IV_{km}$ are connected at their input to an output of the (k−1)th stage or inverter $IV_{(k-1)}$, so that "m" line outputs OUT, OUT2, ... OUTm are formed.

In this embodiment, the following equation hold:

$$F_{(k-1)} = (CG_k + CG_{k2} + \ldots + CG_{km} + CL_{(k-1)})/CG_{(k-1)}.$$

Therefore, assuming $CG_k = CG_{k2} = \ldots = CG_{km}$, $$F_{(k-1)} = (mCG_k + CL_{(k-1)})/(CG_{(k-1)}) \quad (11).$$

The factors other than $F_{(k-1)}$ are the same as the corresponding ones of the first embodiment, and therefore, explanation thereof will be omitted.

Here, assuming $mCG_k = CG_k$, all the equations explained in connection with the first embodiment still hold.

Accordingly, in the second embodiment, similarly to the first embodiment, if the output load capacitance $CL_j$ is determined at any value in each of the output lines, and if the input capacitance of at least two stages of the n-stage inverter circuit and hence the gate length and the gate width of the MOS transistor of the at least two stages are determined, the gate length and the gate width (transistor size) of MOS transistors of the other stages or inverters can be unconditionally determined so as to have a minimized response time.

As explained above, the present invention is characterized in that if the size of an input side MOS transistor and the size of an output side MOS transistor of each of a plurality of cascaded unitary circuits are determined so that the input capacitance and the output load capacitance of each unitary circuit fulfill the above mentioned predetermined equations, it is possible to obtain a semiconductor integrated circuit having the highest speed supported by the theory.

The invention has thus been shown and described with reference to the specific embodiments. However, it should be noted that the present invention is in no way limited to the details of the illustrated structures but changes and modifications may be made within the scope of the appended claims.

I claim:

1. A semiconductor integrated circuit, comprising: "n" cascaded basic unitary circuits each formed of MOS transistors, each of the unitary circuits having an input terminal having a predetermined input capacitance and an output terminal having a predetermined output capacitance, wherein a size of an input side MOS transistor and a size of an output side MOS transistor of each of the unitary circuits are determined by selecting MOS transistors satisfying the following relationships:
ti $F_j = (CG_{(j+1)} + CL_j)/CG_j$ $$F_{(j+1)} = F_j - (CL_j/CG_j)$$

where j is an integer having a value in a range between 1 and "n", inclusive;

where $F_j$ and $F_{(j+1)}$ are fan out of a (j)th and a (j)th unitary circuits, respectively;

where $CG_j$ is said input capacitance of each of said unitary circuits; and where $CL_j$ is a load capacitance which is the sum of the output capacitance of the (j)th unitary circuit and an output parasitic capacitance other than the input capacitance of the (j+1)th unitary circuit having the input terminal connected to the output terminal of the (j)th unitary circuit.

2. The semiconductor integrated circuit as claimed in claim 1, further comprising:

at least "m" (k)th unitary circuits commonly connected to the output terminal of the (k−1)th one of said (k)th unitary circuits, whereby "m" output lines are formed and wherein a size of an input side MOS transistor and a size of an output side MOS transistor of each of the unitary circuits in each of the output lines are determined by selecting MOS transistors satisfying the following relationships:

$$CG_{(k)} = CG_{(k2)} = \ldots = CG_{(km)}$$

$$F_{(k-1)} = (m \times CG_{(k)} + CL_{(k-1)})/CG_{(k-1)}$$

where "k" is an integer of in a range of values "2" to "n" inclusive;

where $CG_{(k)}$ is total capacitance of the "m" (k)th unitary circuits;

where $F_{(k-1)}$ is fan out of a (k−1)th unitary circuit;

where $CG_{(k)}$, $CG_{(k2)}$, ... $CG_{(km)}$ and $CG_{(k-1)}$ are input capacitances of respective unitary circuits; and where $CL_{(k-1)}$ is a load capacitance which is the sum of the output capacitance of the (k−1)th unitary circuit and an output parasitic capacitance other than the input capacitance of the (k)th unitary circuit having the input terminal connected to the output terminal of the (k−1)th unitary circuit.

3. A semiconductor integrated circuit, comprising:

"n" cascased inverters each formed of MOS transistors, each of the inverters having an input terminal having a predetermined input capacitance and an output terminal having a predetermined output capacitance, wherein a size of an input side MOS transistor and a size of an output side MOS transistor of each of the inverters are determined by selecting MOS transistors satisfying the following relationships:

$$F_j = (CG_{(j+1)} + CL_j)/CG_j)$$

$$F_{(j+1)} = F_j - (CL_j/CG_j)$$

where j is an integer in a range between 1 and "n", inclusive;

where $F_j$ and $F_{(j+1)}$ are fan out of a (j)th and (j+1)th inverters, respectively;

where $CG_j$ is said input capacitance of each of said inverters; and where $CL_j$ is a load capacitance which is the sum of the output capacitance of the (j)th inverter and an output parasitic capacitance other than the input capacitance of the (j+1)th inverter having the input terminal connected to the output terminal of the (j)th inverter.

4. A semiconductor integrated circuit according to claim 2, wherein said basic unitary circuits comprise inverters.

5. The semiconductor integrated circuit according to claim 3, further comprising:

"m" (k)th inverters commonly connected to the output terminal of a (k)th one of the (k−1)th inverters, whereby "m" output lines are formed, and wherein a size of an input side MOS transistor and a size of an output side MOS transistor of each of the inverters in each of the "m" output lines are determined by selecting MOS transistors satisfying the following relationships:

$$CG_{(k)} = CG_{(k2)} = \ldots = CG_{(km)}$$

$$F_{(k-1)} = (m \times CG_{(k)} + CL_{(k-1)})/CG_{(k-1)}$$

where "k" is an integer in a range of values "2" to "n" inclusive;

where $CG(k)$ is total input capacitance of said "m" (k)th inverters;

where $F_{(k-1)}$ is fan out of a (k−1)th unitary inverter;

where $CG_{(k)}$, $CG_{(k2)}$, ... $CG_{(km)}$ and $CG_{(k-1)}$ are input capacitances of respective inverters; and where $CL_{(k-1)}$ is a load capacitance which is the sum of the output capacitance of the (k−1)th inverter and an output parasitic capacitance other than the input capacitance of the (k)th inverter having the input terminal connected to the output terminal of the (k−1)th inverter.

* * * * *

UNITED STATES PATENT AND TRADEMARK OFFICE
CERTIFICATE OF CORRECTION

ATENT NO. : 5,305,257
IATED : April 19, 1994
NVENTOR(S) : Shingo AIZAKI

It is certified that error appears in the above-identified patent and that said Letters Patent is hereby orrected as shown below:

Column 1, line 9, delete "cascased" and insert --cascaded--.

Column 4, line 16, delete "hold" and insert --holds--;

line 21, after "assuming" and insert --that--;

line 67, delete "ti".

Column 5, line 5, delete (j)th (second occurrence) and insert --(j + 1)th--;

line 44, delete "cascased" and insert --cascaded--.

Signed and Sealed this

Twentieth Day of September, 1994

Attest:

BRUCE LEHMAN

Attesting Officer     Commissioner of Patents and Trademarks